Sept. 5, 1961 W. A. LAWRENCE, JR 2,999,172

TRANSISTOR TRIGGER CIRCUIT

Filed Dec. 20, 1957

INVENTOR
W. A. LAWRENCE, JR.
BY
S.E. Hollander
ATTORNEY 2,999,172
Patented Sept. 5, 1961

2,999,172

TRANSISTOR TRIGGER CIRCUIT

Watson A. Lawrence, Jr., Boonton, N.J., assignor to Bell Telephone Laboratories, Incorporated, New York, N.Y., a corporation of New York Filed Dec. 20, 1957, Ser. No. 704,114
5 Claims. (Cl. 307—88.5)

This invention relates to electrical pulsing circuits and more particularly to blocking oscillators having high trigger sensitivity and enhanced pulse repetition frequency.

In certain conventional blocking oscillators, a portion of the trigger signal to the oscillator is dissipated through the relatively low impedance of the feedback capacitor and feedback winding of the pulse transformer. Moreover, at high repetition rates, the time required for the feedback capacitor to discharge, or recovery time, imposes an arbitrary upper limit on the pulse repetition frequency.

It is therefore an object of this invention to improve the trigger sensitivity of blocking oscillators.

An additional object of this invention is to decrease the recovery time of blocking oscillators.

A further object of this invention is to minimize attenuation of the input trigger signal through the feedback capacitor and feedback winding of the pulse transformer.

A feature of this invention is the use of a diode connected to the feedback capacitor and poled to present a low impedance during the capacitor discharge cycle.

An additional feature of this invention is the use of a diode connected in series with the feedback capacitor and poled to present a high impedance to the passage of the input signal current.

These and other objects and features of the invention may be realized in one illustrative embodiment by the use of a transistor connected to a pulse transformer for regenerative amplification of an input signal. A diode connected between the feedback capacitor and the base electrode of the transistor prevents dissipation of the input signal through the feedback winding of the pulse transformer thereby enhancing trigger sensitivity. An additional diode is utilized to provide a low impedance discharge path for the feedback capacitor thereby reducing recovery time and permitting higher pulse repetition frequencies.

Figure 1:
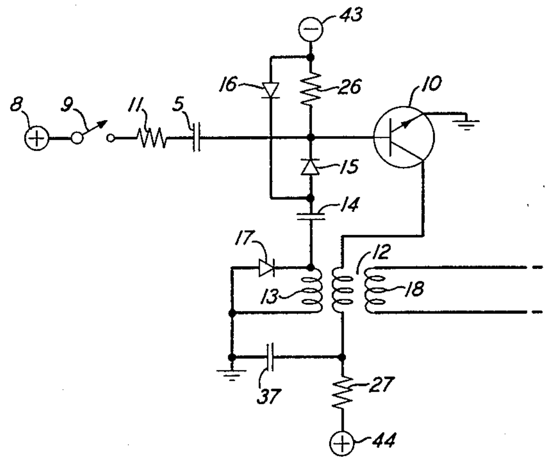
Figure 2:
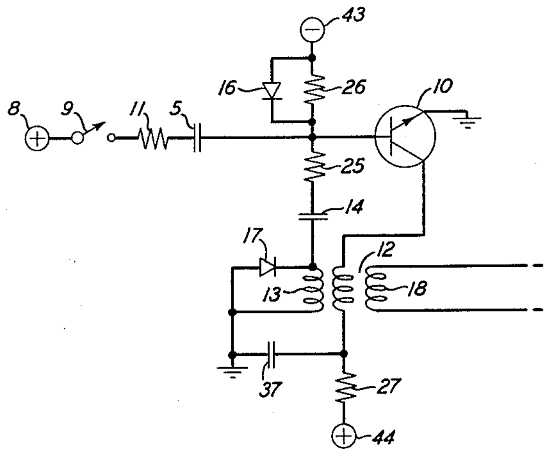

These and other objects and features of the invention may be more readily comprehended from an examination of the following specification, appended claims and attached drawings in which:

FIG. 1 shows an embodiment of the present invention indicating the disposition of diodes in the input circuit to the transistor pulser to increase triggering sensitivity and reduce recovery time; and FIG. 2 illustrates another embodiment of the invention in which a diode connected in parallel with the bias resistor is employed.

Referring to FIG. 1 a blocking oscillator, incorporating a transistor 10 as the active element or amplifier, is shown. The emitter electrode of the transistor is connected to a source of reference potential. The collector supply source 44 is connected through resistance 27 and transformer winding 12 to the collector electrode.

Base bias supply 43 is connected through resistance 26 to the base electrode. A diode 15 couples the base electrode through feedback capacitor 14 to the feedback winding 13.

Diode 15 is poled to resist passage therethrough of current from signal potential source 8. Capacitor 37 stores energy between pulses and serves as a low impedance source.

In operation, when switch 9 is momentarily closed, a positive pulse from source 8 is applied to the base electrode of transistor 10 over resistance 11 and capacitor 5. Diode 15, connected to the base electrode, is poled to present a high impedance to the positive pulse which otherwise would be partially dissipated through feedback capacitor 14 and feedback winding 13 to ground. This positive input signal establishes a forward bias between the base and emitter electrodes of transistor 10 and initiates regenerative action of the pulser.

Variations in collector current through primary winding 12 are reflected back through the feedback winding 13, feedback capacitor 14 and diode 15 to the base electrode in a regenerative amplification path. When capacitor 14 in the feedback circuit charges to a potential sufficient to block further current flow, the current in the collector winding begins to decrease and a degenerative cycle takes place in the manner described for the regenerative situation above. At this time capacitor 14 begins to discharge to the base bias supply over diode 16 which is poled to be in the conductive condition during the discharge cycle of capacitor 14. Diode 17 connected in parallel with feedback winding 13 safely limits the internally generated voltages in the pulse transformer during collapse of the magnetic field.

Output winding 18, which may be connected to any suitable load device or utilization circuit, transfers a pulse coupled from winding 12 to such load device (not shown).

The circuit is now in condition for the next input pulse from source 8 at which time the entire operation as described above will be repeated.

FIG. 2 is an alternative embodiment of a transistor pulser that may be utilized in lieu of that shown in FIG. 1. In FIG. 2 an input pulse over resistance 11 and capacitor 5 triggers transistor 10 to initiate regenerative action therein through primary winding 12, feedback winding 13, feedback capacitor 14 and resistance 25 to the base electrode. Diode 16 in series with resistor 25 provides a discharge path for capacitor 14 to reduce the recovery time of the pulser.

In this embodiment the series blocking diode 15 of FIG. 1 is omitted and resistor 25 is used in lieu thereof. The output from the circuit is taken from winding 18. The remaining operating features are similar to those described for FIG. 1.

As illustrative of the values that the circuit parameters of FIGS. 1 and 2 may assume, the following exemplary relationships are offered:

| Resistances: | Ohms |
|---|---|
| 11 | 100 |
| 25 | 100 |
| 26 | 10,000 |
| 27 | 100 |

| Capacitors: | Microfarads |
|---|---|
| 5 | 0.1762 |
| 14 | 0.0056 |
| 37 | 5 |

| Diodes: | |
|---|---|
| 15 | Hughes 1N463 or the like |
| 16 | Hughes 1N463 or the like |
| 17 | Hughes 1N463 or the like |

| Potential sources: | Volts |
|---|---|
| 8 | +5 |
| 43 | −1.5 |
| 44 | +22.5 |

| Transformer winding ratio: | Turns |
|---|---|
| 12 | N |
| 13 | N |
| 18 | 2N |

Although a transistor has been utilized as the active element or amplifier in the above description, it is understood that other suitable components including but not limited to vacuum tubes may be used in lieu of the transistor.

It is understood that the embodiments shown above are exemplary, the suggested values for circuit parameters are merely illustrative and that numerous modifications will be apparent to those skilled in the art without departing from the scope or spirit of the present invention.

What is claimed is:

1. A blocking oscillator including a transistor having a base, emitter and collector electrode, a transformer having a feedback, primary and output winding, impedance means, a condenser connecting said feedback winding through said impedance means to said base electrode to provide a regenerative amplification path, a signal source adapted when energized to supply a signal to said base electrode, said impedance means being adapted to resist the passage therethrough of said signal from said signal source, collector potential supply means connected through said primary winding to said collector electrode, a source of reference potential connected to said emitter electrode, base bias potential supply means connected to said base electrode, a first diode connected to said impedance means and to said base bias supply means, said first diode adapted to be in the conductive condition during the discharge cycle of said condenser, a resistor connected across said first diode, and a second diode connected in parallel with said feedback winding, whereby the operation of said signal source initiates regenerative action in said oscillator to produce an output pulse in said output winding.

2. A pulse generator including a transistor having a base, emitter and collector electrode, a transformer having a plurality of windings, a condenser connected to one of said windings, an input signal source adapted when operated to supply a signal to said base electrode, means connecting another of said windings to said collector electrode, means for supplying operating potentials to said emitter and collector electrodes, a first asymmetrically conducting device connected to said condenser, said asymmetrically conducting device being poled to be in the conductive condition during the discharge cycle of said condenser, and a second asymmetrically conducting device joining said condenser to said base electrode, said second asymmetrically conducting device being poled to block the passage therethrough of signals from said input signal source.

3. A pulser including a transistor having a base, emitter and collector electrode, a transformer having a plurality of windings, a condenser connected to a first of said windings to provide a regenerative amplification path, an input signal source adapted when operated to supply a signal to said base electrode, means connecting a second of said windings to said collector electrode, means for supplying operating potentials to said emitter and collector electrodes, a third winding inductively coupled to said first and second windings, a first unilaterally conducting device connected to said condenser, said unilaterally conducting device being adapted to be in the conductive condition during the discharge cycle of said condenser, a second unilaterally conducting device joining said condenser to said base electrode, said second unilaterally conducting device being poled to block the passage therethrough of input signals from said input signal source, whereby regenerative action in said pulser produces an output pulse in said third winding in response to the operation of said signal source.

4. A pulser including a transistor having a base, emitter and collector electrode, a transformer having a feedback, primary and output winding, a condenser connected to said feedback winding, an input signal source adapted when operated to supply a signal to said base electrode, means connecting said primary winding to said collector electrode, means for supplying operating potentials to said emitter and collector electrodes, a first diode joining said condenser to said base electrode, said first diode adapted to be in the conductive condition during the discharge cycle of said condenser, a second diode connected in parallel with said feedback winding to limit the magnitude of induced voltages therein, and a third diode joining said condenser to said base electrode, said third diode being adapted to block the passage therethrough of input signals from said input signal source, whereby the operation of said input signal source initiates regenerative action in said pulser to produce an output pulse in said output winding.

5. A blocking oscillator including a transistor having a base, emitter and collector electrode, a transformer having a feedback, primary and output winding, a condenser connected to said feedback winding, an input signal source adapted when operated to supply a signal to said base electrode, collector potential supply means connected through said primary winding to said collector electrode, a source of reference potential connected to said emitter electrode, base bias potential supply means connected to said base electrode, a first diode connected to said condenser and to said base bias supply means, said first diode adapted to be in the conductive condition during the discharge cycle of said condenser, a second diode connected in parallel with said feedback winding to limit the induced voltage therein, and a third diode connected to said condenser, to said base electrode, and through impedance means to said base bias supply means, said third diode being poled to block the passage therethrough of input signals from said input signal source, whereby the operation of said input signal source initiates regenerative action in said oscillator to produce an output pulse in said output winding.

References Cited in the file of this patent

UNITED STATES PATENTS

| | | |
|---|---|---|
| 2,764,688 | Grayson et al. | Sept. 25, 1956 |
| 2,787,707 | Cockburn | Apr. 2, 1957 |
| 2,810,080 | Trousdale | Oct. 15, 1957 |
| 2,816,230 | Lindsay | Dec. 10, 1957 |
| 2,838,669 | Horsch | June 10, 1958 |
| 2,848,613 | Green et al. | Aug. 19, 1958 |
| 2,850,648 | Elliott | Sept. 2, 1958 |
| 2,873,388 | Trumbo | Feb. 10, 1959 |
| 2,922,037 | Reise | Jan. 19, 1960 |

OTHER REFERENCES

Eckess et al.: "Transistor Pulse Generators," Electronics, November 1955, pp. 132–133.